US006715246B1

(12) United States Patent
Frecska et al.

(10) Patent No.: US 6,715,246 B1
(45) Date of Patent: Apr. 6, 2004

(54) CEILING TILE TRANSMITTER AND RECEIVER SYSTEM

(75) Inventors: Sandor A. Frecska, Lancaster, PA (US); John E. Cronin, Milton, VT (US)

(73) Assignee: Armstrong World Industries, Inc., Lancaster, PA (US)

( * ) Notice: Subject to any disclaimer, the term of this patent is extended or adjusted under 35 U.S.C. 154(b) by 176 days.

(21) Appl. No.: 09/604,523

(22) Filed: Jun. 27, 2000

Related U.S. Application Data

(60) Provisional application No. 60/148,060, filed on Aug. 10, 1999.

(51) Int. Cl.[7] ................................................ H05K 5/00

(52) U.S. Cl. ......................... 52/220.6; 52/220.1; 52/27; 52/316; 340/693.5; 340/693.11; 312/245; 181/150

(58) Field of Search ............................ 52/220.6, 220.1, 52/220.8, 506.06, 747.1, 578, 316, 27; 340/693.5, 693.9, 693.11; 174/40 R; 312/242, 245; 181/198, 150, 153; 343/872, 873

(56) References Cited

U.S. PATENT DOCUMENTS 4,330,691 A 5/1982 Gordon
4,456,793 A 6/1984 Baker et al.
4,847,501 A * 7/1989 Warner et al. .............. 250/342
4,923,032 A 5/1990 Nuernberger
4,928,312 A 5/1990 Hill
5,316,254 A 5/1994 McCartha
5,516,068 A 5/1996 Rice
5,565,855 A 10/1996 Knibbe
5,619,217 A 4/1997 Mailandt et al.
5,742,895 A 4/1998 Tanigawa et al.
5,748,092 A 5/1998 Arsenault et al.
5,802,467 A 9/1998 Salazar et al.
6,015,025 A * 1/2000 McGrath et al. ............ 181/199
6,117,514 A * 9/2000 Herrmann .................... 428/81
6,295,036 B1 * 9/2001 Mata et al. ................. 343/878

FOREIGN PATENT DOCUMENTS

GB 2283642 5/1995 ............ H04B/1/03

* cited by examiner

*Primary Examiner*—Carl D. Friedman
*Assistant Examiner*—Jennifer I. Thissell

(57) ABSTRACT

A ceiling tile transmitter and receiver system having at least one transmitter/receiver device located in a ceiling panel either during or after the ceiling panel fabrication process. In one embodiment one or more pockets of variable size and shape are created on a surface of the ceiling panel during or after the ceiling panel manufacturing process and then a transmitter/receiver device, such as an RF antenna, is inserted in the pocket. In another embodiment, the transmitter/receiver device is embedded in the front side (lower surface) of the ceiling tile and a "scrim" covering is placed over it to secure it in place. The transmitter/receiver device can also be embedded inside the ceiling tile or on an upper, lower or side surface of the ceiling tile. Various combinations of these embodiments can be used with a single ceiling tile. A high temperature resistant "place holding" structure that can withstand the ceiling tile treatments can be provided and later removed to allow the installation of the transmitter/receiver device.

35 Claims, 6 Drawing Sheets

CEILING TILE TRANSMITTER AND RECEIVER SYSTEM

CROSS-REFERENCE TO RELATED APPLICATION

The present invention is a formalization of a previously filed, co-pending U.S. Provisional Patent Application entitled "Ceiling Tile and Transmitter/Receiver System", filed Aug. 10, 1999 as Ser. No. 60/148,060 by the inventors name in this patent application. This patent application claims the benefit of the filing date of the cited Provisional Patent Application, according to the statutes and rules governing provisional patent applications, particularly 35 U.S.C §119(e)(1) and 37 C.F.R. §1.78(a)(3) and (a)(4). The specification and drawings of the Provisional Patent Application are specifically incorporated by reference herein.

BACKGROUND OF THE INVENTION

During recent years in the designing or retrofitting of buildings, there has become an ever more pressing need to increase design flexibility. With the pervasive use of digital electronics, building designs now need to incorporate such infrastructure as digital communications, Internet connections, local area network connections, increased voice communications capability, and the like. Also, more and more appliances, such as security, sound, paging, heating, ventilating and air conditioning (HVAC), lighting, heating and cooling systems are digitally controlled. This technology has placed even more stress on the building design which has to include communications bus systems between the various appliances and some central control system.

The building management systems that control these appliances have also evolved. Computer control is now fundamental to building management systems. This has lead the way to the measurement and control of the aforementioned appliances. By adding computer control, great savings in energy costs are achieved in terms of turning devices on or off, or adjusting appliances, based upon user needs or even user projected needs. Also, the remote control of systems has enabled the building management function to be done off premises.

Building management systems contain various appliances for building service functions, a control system for control and regulation of the appliances, and a communication bus for communication of signals between the control system and the appliances. Such a system is used for the central management of building functions, such as lighting, heating, and ventilation etc. The appliances include, for example, lighting, heating equipment, air-conditioning devices or electrically movable window blinds. In office buildings and commercial and industrial complexes, the central management of energy consumption services allows a relatively easy adjustment of the level of light or temperature to the actual existing demand at any moment. This results in considerable savings of energy and costs. Such a system precisely monitors energy consumption and enables accurate billing of the users in a multi-user building. Such a building management system can also be used for peak saving purposes to comply with the requirements of an electric company to keep power consumption below an agreed maximum level.

Many building management systems have different capability, which leads to having different transmitter/receiver devices in the same ceiling system, or more importantly, a different method to integrate these different transmitter/receiver devices. For instance, one communication system may require one frequency setting whereas another communication system may require an entirely different frequency setting. Also, one communication system may require a certain power or gain, whereas another would be different. Antenna gain is related to antenna size, and therefore if more gain is needed, the size of the antenna is increased.

Aesthetics have become of primary importance in building ceiling systems. Many ceiling manufacturers offer a wide variety of designs and colors for their suspended ceiling systems.

Furthermore, many appliances are attached or hung from the ceiling panels or ceiling suspension grids. Today unfortunately, theft and vandalism have become issues, and at times devices such as smoke detectors, fire alarms, lighting fixtures, etc. have been vandalized.

In the known systems, the local controllers and the appliances are connected to the communication bus by wires. In a modem office building or commercial complex this is a drawback as space layouts are often changed. Changing space layouts almost always requires displacement of the appliances and frequently the tearing down and rebuilding of internal walls. To achieve a flexible floor layout at low cost, a minimum amount of wiring in the walls is required. However, it is also essential that the users of a building have full control over the location of the appliances; consequently, placing appliances only at predetermined locations is unacceptable. In current systems, a hardwired communication bus is used to connect to the local room wireless transmitter/receiver systems. These wireless transmitter/receiver systems are used to communicate between the bus and the appliances in the room. However, the communication bus system is still a "hardwired" configuration. This leads to a decrease in flexibility, since a room's square footage may change over time, and therefore the transmitter/receiver devices and the hardwired communication bus may also need to be changed or rerouted. Rerouting or changing current transmitter/receiver devices requires modifying ceiling panels (drilling/punching/cutting) and replacing the ceiling tiles that had the transmitter/receiver device in it.

Another problem occurs in that transmitter/receiver devices have poor aesthetics when suspended from ceiling panels. After much design and expense have been invested in a ceiling panel system, a rod or dish antenna system is added to the ceiling panel to allow it to communicate to appliances below. There has not been much consideration given in terms of the room aesthetics of a joint system of antennas and ceiling panels.

Another problem occurring in the industry is vandalism and theft. When devices can be physically seen, they are more prone to be tampered with or removed.

Still another problem occurs in the design of ceiling tile panels that can be integrated with antennas of different sizes. In the manufacturing and sales of ceiling tiles, processes have to be made flexible to account for all of the different part numbers corresponding to transmitter/receiver devices.

SUMMARY OF THE INVENTION

The basic concept of the present invention is to attach or embed at least one transmitter/receiver device in a ceiling panel either during or after the ceiling panel manufacturing process. The invention concept involves a number of related embodiments. In a first embodiment at least one pocket depression is formed on the backside of the ceiling panel, of variable size and shape, by the ceiling panel manufacturing process and then a transmitter/receiver device, such as an RF antenna, is inserted and rigidly fixed in the pocket after ceiling panel manufacturing. The terms ceiling panel and ceiling tile are used interchangeably throughout this description.

In another embodiment, the transmitter/receiver device is embedded in the front side of the ceiling tile and a "scrim" covering is placed over it. The transmitter/receiver device can also be embedded inside the ceiling tile or rigidly fixed on the top or side surface of the ceiling tile. The transmitter/receiver device can also be embedded on the front surface of the ceiling tile, where the transmitter adds to, or integrates into, the overall aesthetics of the ceiling tile. Various combinations of these embodiments can be used with a single ceiling tile.

Other inventive concepts involve manufacturing aspects. There are several different ceiling tile manufacturing processes that can be used for embedding the transmitting/receiving devices. A high temperature resistant "place holding" structure that can withstand the ceiling tile treatments can also be provided that can be removed later to allow the mounting of the transmitter/receiver device.

BRIEF DESCRIPTION OF THE DRAWINGS

The invention is better described by reading the following Detailed Description of the Invention with reference to the accompanying drawing figures, in which like numerals refer to like elements throughout.

DETAILED DESCRIPTION OF THE INVENTION

Figure 1:
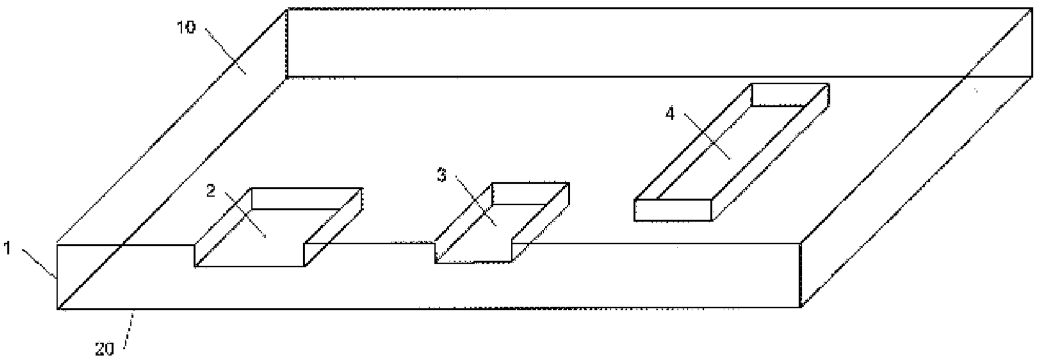
FIG. 1 illustrates a ceiling tile with formed or cut pockets on the back surface for rigidly fixing antennas or other electronic devices in accordance with an exemplary embodiment of the present invention.

In a first embodiment of the invention, at least one pocket depression is formed on the backside of the ceiling panel during the ceiling panel manufacturing process, wherein each pocket depression can be of a different size and shape, and antennas, or other electronic components, are rigidly fixed in these pockets after ceiling panel manufacturing. Shown in FIG. 1 is a section from a ceiling tile 1, with back surface (facing towards the plenum) 10 and a front surface (facing towards the room) 20. Throughout this description, the terms "back surface" and "upper surface" are used interchangeably. Likewise "front surface" and "lower surface" are interchangeable. Depicted in the figure are pockets 2, 3, and 4. These pockets can be made of different dimensions in width, length and depth, to account for various possible sizes and shapes of the transmitter/receiver antennas or other electronic devices to be inserted.

A ceiling tile router can be used to cut pockets 2, 3, 4 after the ceiling tiles are fully manufactured. These pockets also can be stamped on the back side after the ceiling tile is wet manufactured. Alternately, these pockets can be defined by placing a ceramic placeholder during the forming process of the ceiling tile, so that the ceiling tile is wet-formed and then cured. When the ceiling tile dries, the ceramic placeholders are removed. These are just a few of the possible methods of creating these pockets.

Figure 2:
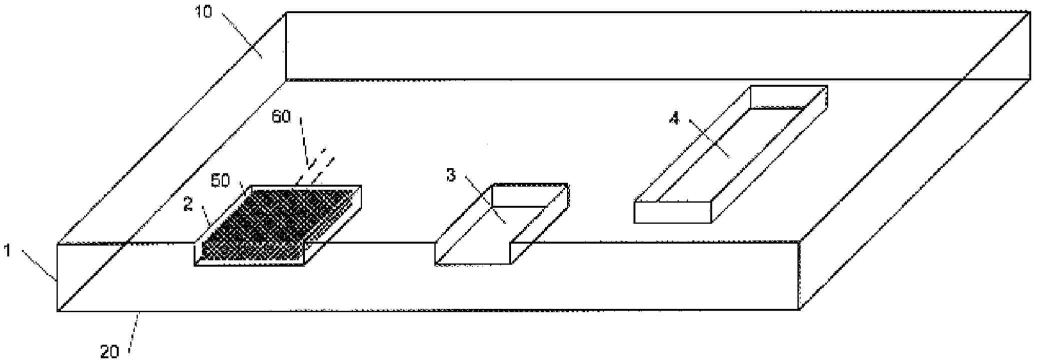
FIG. 2 illustrates a ceiling tile with formed pockets on the back surface with one pocket containing a transmitter/receiver device in accordance with an exemplary embodiment of the present invention.

FIG. 2 illustrates a ceiling tile 1 with an antenna 50 having electrical leads 60, and which can be used for the transmission or reception of radio frequency (RF) signals. The antenna is placed in the pocket 2 of the ceiling tile 1. The pockets are designed so as to allow any of multiple sizes and shapes of antennas to be placed in the pockets. These antennas can simply be glued or clamped into the pocket. The electrical leads are usually of the coaxial type with easy to connect connectors.

Figure 3:
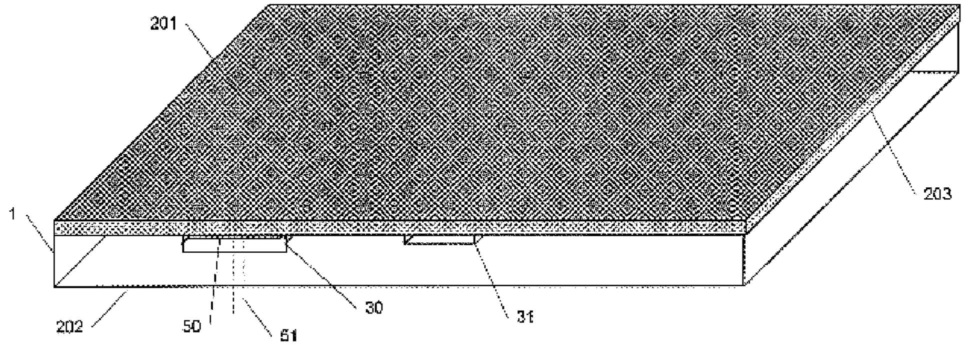
FIG. 3 illustrates a ceiling tile with formed pockets on the front surface for containing a transmitter/receiver device, and a scrim cover for attaching to the front surface in accordance with an exemplary embodiment of the present invention.

In a second embodiment of the invention the transmitter/receiver is embedded in the front side of the ceiling tile and a "scrim" covering is placed over it. Such an embodiment is depicted in FIG. 3 with a ceiling panel 1 having a top surface 203 and a bottom surface 202. This structure is shown inverted from the structures illustrated in FIGS. 1 and 2 in which the back of the ceiling tile faces up, whereas in FIG. 3 the front of the ceiling tile faces up. Pockets 30 and 31 are shown, fabricated as before. Antenna 50 is placed/fixed in pocket 30, with electrical leads 51 being routed out through the back of the ceiling panel. A hole is formed from the pocket to the back of the ceiling tile by a drill or other means. The scrim 201, normally used in aesthetic ceiling tiles, is a sheath stretched and glued over the front face 203 of the ceiling tile 1. As can be seen, this scrim covers both the ceiling tile 1 and the antenna 50.

In high volume manufacturing of ceiling tiles, many pockets may be formed in the ceiling tile but not filled with an antenna, as discussed above. In the example of FIG. 3, the scrim also covers an empty pocket 31. In the case of some pockets being too wide or too deep to effectively cover without the scrim or its process deforming the scrim in that region, a dummy antenna structure is placed in the pocket. The antenna and dummy structure, if any, are glued into place.

Figure 4:
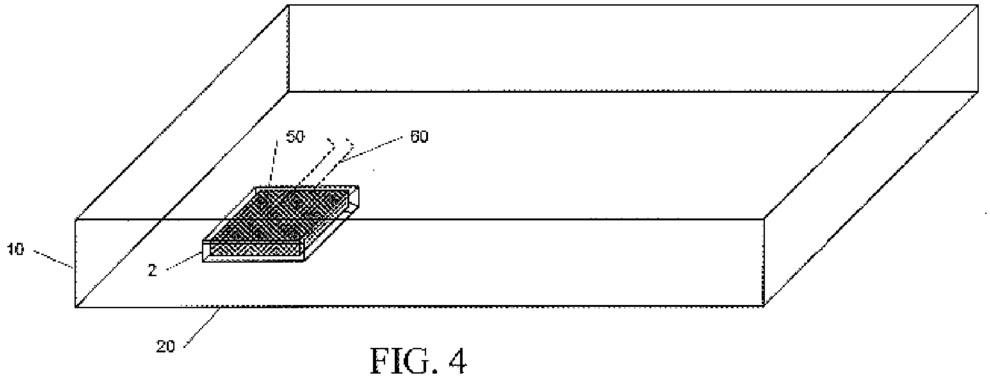
FIG. 4 illustrates a transmitter/receiver device embedded within a ceiling tile in accordance with an exemplary embodiment of the present invention.

In a third embodiment of the invention, the transmitter/receiver device is embedded inside the ceiling tile. As illustrated in FIG. 4, in certain applications, the antenna 50 in pocket 2 with extruding leads 60 can be effectively buried within the ceiling tile 1, with back surface 10 and front surface 20. Note that the extruding leads 60 are protruding from the back surface 10. This embodiment fully protects the antenna or device from any outside sources of mechanical damage, and provides the antenna or device with further environmental protection from moisture etc., that the ceiling tile allows.

The antenna or device can be encapsulated during part of the ceiling tile manufacturing process, if the highest temperature of the ceiling tile manufacturing process is lower than the limit that the antenna can withstand. During normal ceiling tile manufacturing, temperatures of 350° C. are often reached. The semiconductor process used to form an antenna is usually above the 350° C. level, and the thermoset glue used to hold the rest of the antenna structure together can be designed to be higher than the 350° C. ceiling tile process limit.

Figure 9:
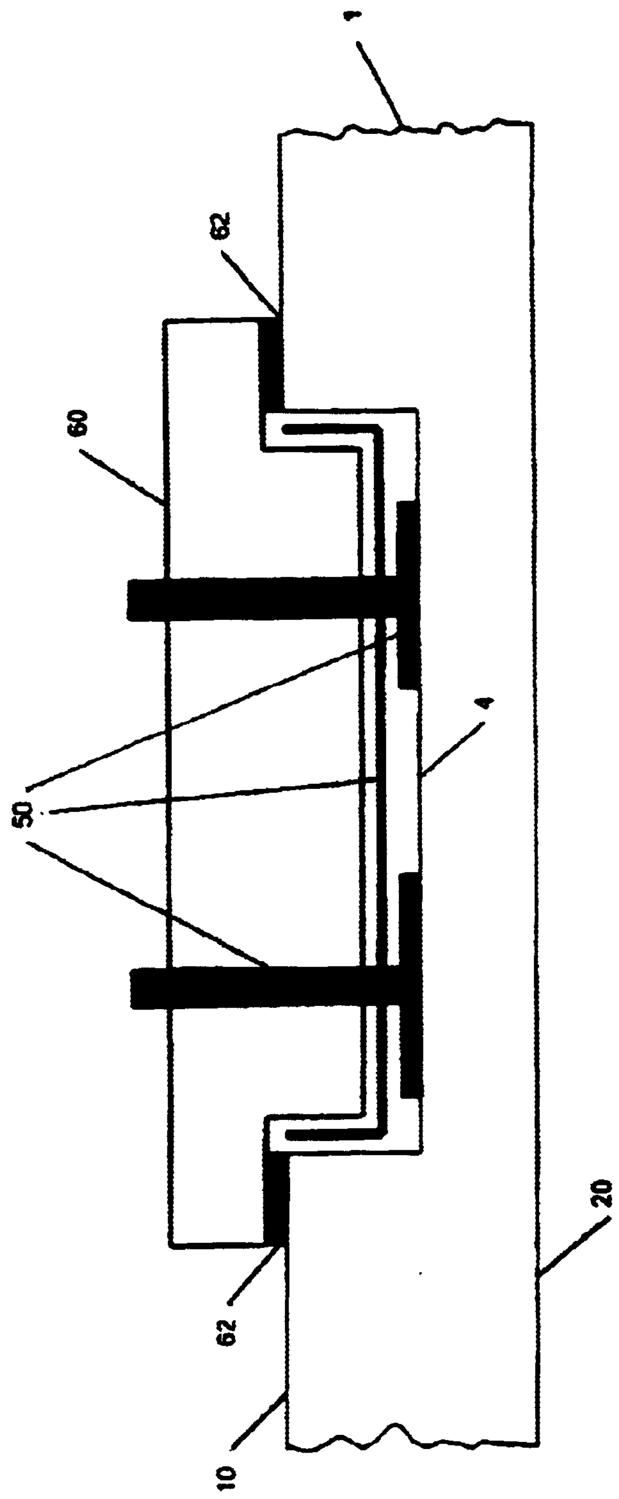
FIG. 9 illustrates a transmitter/receiver device that is embedded inside a ceiling tile by an adhesive that attaches a "plug" or retainer of ceiling tile material to cover the opening in the ceiling tile.

Another method to completely encapsulae the antenna is to form a deep pocket in the ceiling tile as illustrated in FIG. 1. Next, the antenna is fixed in the deep pocket followed by a back fill of the rest of the opening with a plug of ceiling tile that is glued in. This is shown more clearly in FIG. 9 in which transmitter/receiver device 50 is fixed in ceiling panel 1 in a pocket depression 4 formed on the upper surface 10. Note that the pocket depression does not extend to the lower surface 20. The "plug" or retainer 60 made of ceiling tile panel material fills in the rest of the opening and is kept in place by adhesive layer 62.

Figure 5:
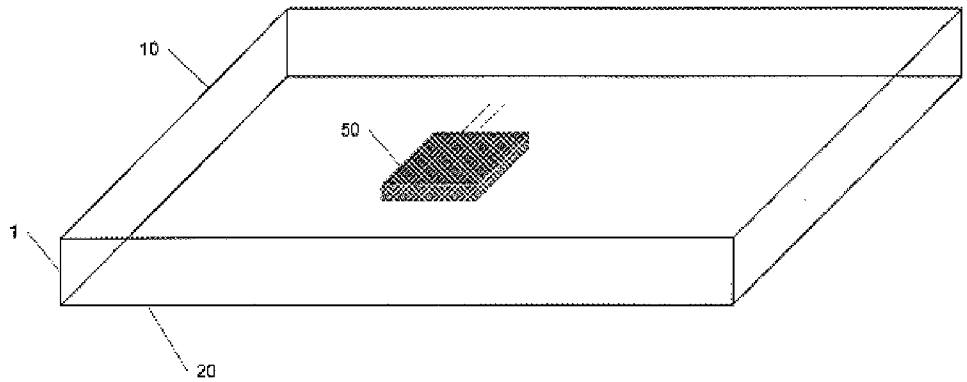
FIG. 5 illustrates a transmitter/receiver device that is rigidly fixed to the back surface of a ceiling tile in accordance with an exemplary embodiment of the present invention.
Figure 6:
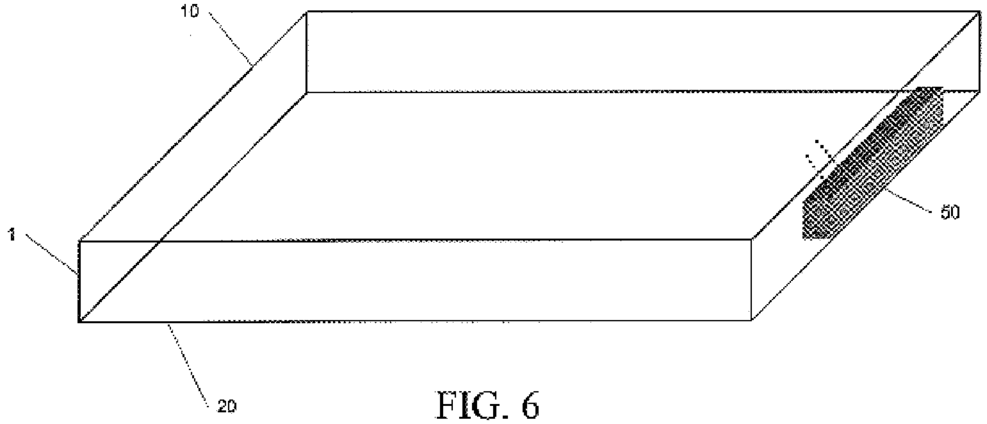
FIG. 6 illustrates a transmitter/receiver device that is rigidly fixed to a side surface of a ceiling tile in accordance with an exemplary embodiment of the present invention.
Figure 10:
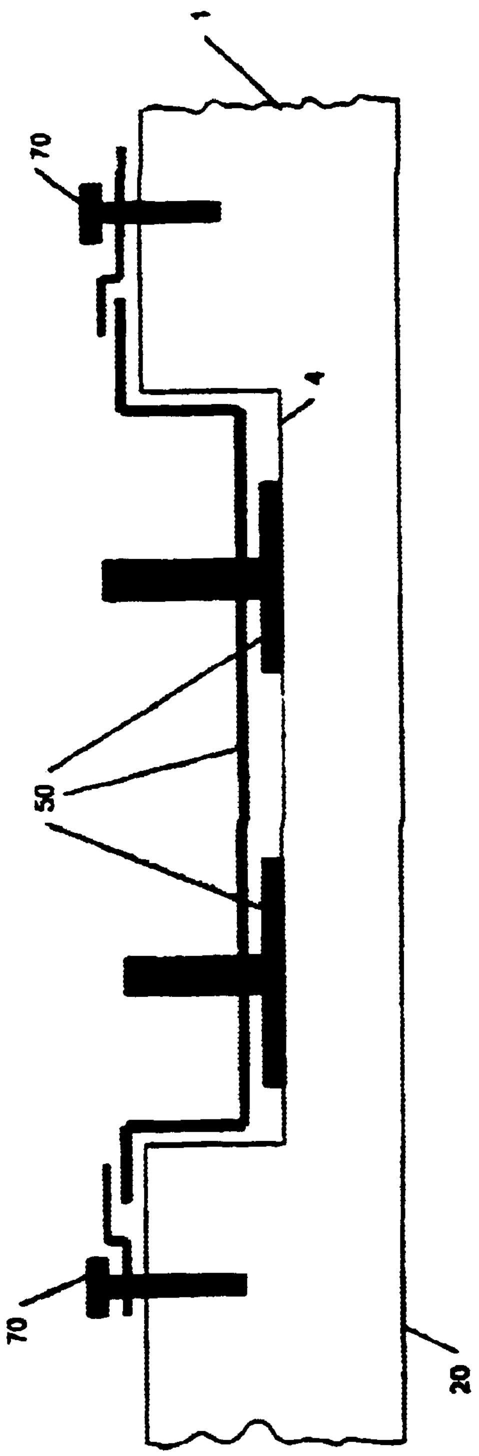
FIG. 10 illustrates a transmitter/receiver device that is secured inside a pocket depression formed in the ceiling tile material by clamps.

In other embodiments of the invention, the transmitter/receiver is rigidly fixed on the top or side surface of the ceiling tile. As shown in FIG. 5, the antenna or transmitter/receiver device 50 is rigidly fixed by glue, clamps or other means to the back surface 10 of ceiling tile 1. FIG. 10 illustrates more clearly the use of clamps 70 to rigidly fix transmitter/receiver device 50 in a pocket depression 4 on the upper surface 10. As further shown in FIG. 6, the antenna or transmitter/receiver device 50 is rigidly fixed by glue, clamps or other means to the side of ceiling tile 1 in another embodiment.

Figure 7:
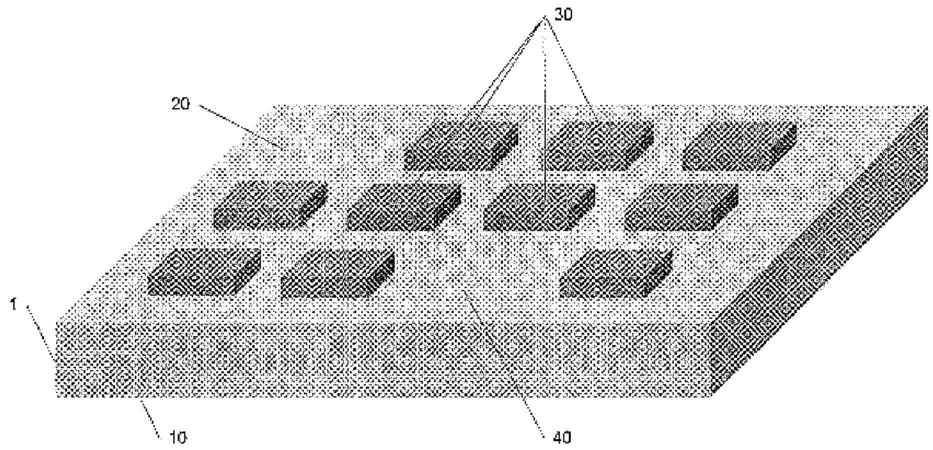
FIG. 7 illustrates a ceiling tile having several surface features positioned on the front surface of a ceiling tile in accordance with an exemplary embodiment of the present invention.
Figure 8:
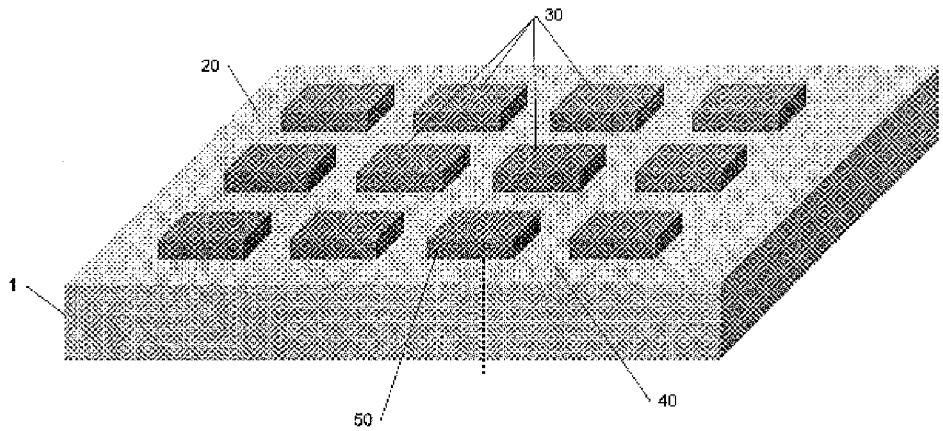
FIG. 8 illustrates a transmitter/receiver device that is encased on the front surface of a ceiling tile in accordance with an exemplary embodiment of the present invention.

In yet another embodiment of the invention, the transmitter is encased on the front surface of the ceiling tile, where the transmitter adds to, or integrates into, the overall aesthetics of the ceiling tile. FIGS. 7 and 8 show a ceiling panel 1 with a back surface 10 and a front surface 20. Decorative surface features 30 are shown on the front surface to create an aesthetic appeal. As can be seen in region 40 on front surface 20, an aesthetic surface feature is missing intentionally. As depicted in FIG. 8, an antenna or device 50 is placed/fixed in region 40 in the exact position where a surface feature would have been defined. The antenna is encased so as to look like a surface feature. The leads 40 are shown as being passed through from the front surface 10 to the back surface 20 hidden from view.

The ceiling tile transmitter and receiver system described herein can be incorporated into a wireless communication plane providing an umbrella of connectivity for devices. Such devices can span a range from appliances to computer clients (workstations, laptops, hand-held devices, etc.). In a wireless communication system, RF antennas, transceivers and receivers can be embedded or affixed to the ceiling tile.

As described herein, the transmitters/receivers can be embedded in the ceiling tile. The components of the transmitter/receiver system include miniature antennas, single chip transceivers, sensors, power supplies, microprocessors, etc. The transmitter/receiver system in one preferred embodiment employs an omnidirectional multistrip antenna that has a toroidal field pattern and provides omnidirectional coverage in any plane around the long axis of the antenna and two lobes in any plane parallel to the long axis. Such microstrip antenna and also omnidirectional air-loaded patch element antennas are available for different frequencies and application requirements. One exemplary antenna that can be used is the Microsphere omnidirectional microstrip antenna available from Xertex Technologies.

Although the present invention has been described in the context of the manufacturing of ceiling tiles that incorporate embedded or affixed transmitter/receiver devices either during or after the manufacture of ceiling tiles, the invention is equally applicable to the installation of transmitter/receiver devices in existing ceiling tiles. To serve that end, it is a simple extension to provide a retrofitting kit to building supply vendors, building contractors or directly to other parties that includes the tools and additional hardware required to form pockets in existing ceiling tiles to accommodate transmitter/receiver devices and to rigidly affix the transmitter/receiver devices in the pockets or on a surface of the ceiling tile.

Furthermore, the corresponding structures, materials, acts and equivalents of any means plus function elements in the claims below are intended to include any structure, material, or acts for performing the functions in combination with other claimed elements as specifically claimed.

While the invention has been particularly shown and described with reference to preferred embodiments thereof, it will be understood by those skilled in the art that various other changes in form and detail may be made without departing from the spirit and scope of the invention.

What is claimed is:

1. A ceiling tile transmitter and receiver system for transmitting and receiving electromagnetic signals in a defined area of a building space, comprising:

a ceiling tile including a lower surface, an upper surface and a plurality of lateral side surfaces, with one of the surfaces modified to form a pocket depression extending partially through the ceiling tile in order to insert a transmitter/receiver device completely; and transmitter/receiver device fully inserted into the one modified surface.

2. The ceiling tile transmitter and receiver system of claim 1 wherein the transmitter/receiver device is rigidly affixed in a pocket on the upper surface of the ceiling tile.

3. The ceiling tile transmitter and receiver system of claim 1 wherein the transmitter/receiver device is rigidly affixed in a pocket on a lateral side surface of the ceiling tile.

4. The ceiling tile transmitter and receiver system of claim 1 wherein the transmitter/receiver device is rigidly affixed in a pocket on the lower surface of the ceiling tile.

5. The ceiling tile transmitter and receiver system of claim 4 further comprising a scrim cover placed over the entire lower surface of the ceiling tile.

6. The ceiling tile transmitter and receiver system of claim 1 wherein the at least one pocket depression is formed by cutting the pocket in the surface of the ceiling tile with a ceiling tile router.

7. The ceiling tile transmitter and receiver system of claim 1 wherein the pocket depression is formed by stamping the pocket in the surface after the ceiling tile is wet manufactured.

8. The ceiling tile transmitter and receiver system of claim 1 wherein the pocket depression is formed by placing a ceramic placeholder for the pocket in the one surface during the forming and curing of the ceiling tile, the ceramic placeholder being removed after the ceiling tile dries.

9. The ceiling tile transmitter and receiver system of claim 1 further comprising a plurality of pocket depressions that are formed in at least one surface for the insertion of transmitter/receiver devices wherein each pocket depression extends partially through the ceiling tile.

10. The ceiling tile transmitter and receiver system of claim 1 wherein the transmitter/receiver device is secured inside the formed pocket by applying an adhesive material.

11. The ceiling tile transmitter and receiver system of claim 1 wherein the transmitter/receiver device is secured inside the formed pocket by a clamp.

12. The ceiling tile transmitter and receiver system of claim 1 wherein the electromagnetic signals are radio frequency (RF) signals and the transmitter/receiver device is an RF antenna.

13. The ceiling tile transmitter and receiver system of claim 12 wherein the RF antenna is a microstrip antenna.

14. The ceiling tile transmitter and receiver system of claim 12 wherein the RF antenna includes an omnidirectional air-loaded patch element.

15. The ceiling tile transmitter and receiver system of claim 1 wherein the transmitter/receiver device is located above the plane formed by the lower surface of a ceiling suspension system.

16. The ceiling tile transmitter and receiver system of claim 1 wherein the transmitter/receiver device includes at least one of a miniature antenna, a single chip transceiver, an electromagnetic sensor, a power supply and a microprocessor.

17. A ceiling tile transmitter and receiver system for transmitting and receiving electromagnetic signals in a defined area of a building space, comprising:

a ceiling tile including a lower surface, an upper surface and a plurality of lateral side surfaces; and a transmitter/receiver device embedded inside a pocket in the ceiling tile, wherein the pocket extends partially through the ceiling tile.

18. The ceiling tile transmitter and receiver system of claim 17 wherein the transmitter/receiver device is embedded adjacent to the lower surface and further comprises a scrim cover placed over the entire lower surface of the ceiling tile.

19. The ceiling tile transmitter and receiver of claim 17 wherein the transmitter/receiver device is encapsulated within the ceiling tile during the manufacturing process.

20. A ceiling tile transmitter and receiver system for transmitting and receiving electromagnetic signals in a defined area of a building space, comprising:

a ceiling tile including a lower surface, an upper surface and a plurality of lateral side surfaces; and at least one transmitter/receiver device embedded inside the ceiling tile, wherein the transmitter/receiver device is embedded inside the ceiling tile by an adhesive that attaches a plug of ceiling tile to the transmitter/receiver device to cover the opening created in the ceiling tile.

21. The ceiling tile transmitter and receiver system of claim 17 wherein the electromagnetic signals are radio frequency (RF) signals and the transmitter/receiver device is an RF antenna.

22. The ceiling tile transmitter and receiver system of claim 21 wherein the RF antenna is a microstrip antenna.

23. The ceiling tile transmitter and receiver system of claim 21 wherein the RF antenna includes an omnidirectional air-loaded patch element.

24. The ceiling tile transmitter and receiver system of claim 17 wherein the transmitter/receiver device includes at least one of a miniature antenna, a single chip transceiver, an electromagnetic sensor, a power supply and a microprocessor.

25. A method for fabricating a ceiling tile transmitter and receiver system for transmitting and receiving electromagnetic signals in a defined area of a building space, comprising:

forming a pocket depression on any of the external surfaces of the ceiling tile and extending partially through the ceiling tile in order to install a transmitter/receiver device completely; and fully inserting a transmitter/receiver device in the pocket depression formed on an external surface.

26. The method for fabricating a ceiling tile transmitter and receiver system of claim 25 wherein the transmitter/receiver device is fully inserted in a pocket depression on an upper surface of the ceiling tile.

27. The method for fabricating a ceiling tile transmitter and receiver system of claim 25 wherein the transmitter/receiver device is fully inserted in a pocket depression on a lateral side surface of the ceiling tile.

28. The method for fabricating a ceiling tile transmitter and receiver system of claim 25 wherein the transmitter/receiver device is fully inserted in a pocket depression on a lower surface of the ceiling tile.

29. The method for fabricating a ceiling tile transmitter and receiver system of claim 26 further comprising adhering a scrim cover to the entire lower surface of the ceiling tile.

30. The method for fabricating a ceiling tile transmitter and receiver system of claim 25 further comprising forming a pocket depression by cutting the pocket on the external surface of the ceiling tile with a ceiling tile router.

31. The method for fabricating a ceiling tile transmitter and receiver system of claim 25 further comprising forming a pocket depression by stamping the pocket on the external surface after the ceiling tile is wet manufactured.

32. The method for fabricating a ceiling tile transmitter and receiver system of claim 25 further comprising forming a pocket depression by placing a ceramic placeholder for the pocket during the forming and curing of the ceiling tile and removing the ceramic placeholder after the ceiling tile dries.

33. The method for fabricating a ceiling tile transmitter and receiver system of claim 25 further comprising securing the transmitter/receiver device inside the formed pocket by applying an adhesive material.

34. The method for fabricating a ceiling tile transmitter and receiver system of claim 25 further comprising clamping the transmitter/receiver device inside the formed pocket.

35. The method for fabricating a ceiling tile transmitter and receiver system of claim 25 wherein the transmitter/receiver device includes at least one of a miniature antenna, a single chip transceiver, an electromagnetic sensor, a power supply and a microprocessor.

* * * * *